United States Patent [19]

Nelson

[11] 4,414,512
[45] Nov. 8, 1983

[54] BROADBAND PEAK DETECTOR

[75] Inventor: Robert N. Nelson, Scottsdale, Ariz.

[73] Assignee: Motorola Inc., Schaumburg, Ill.

[21] Appl. No.: 268,430

[22] Filed: May 29, 1981

[51] Int. Cl.³ .......................................... H03K 5/153
[52] U.S. Cl. .................................. 328/151; 307/351;
307/261; 307/362
[58] Field of Search .............. 307/261, 268, 228, 354, 307/362, 363, 351, 352, 353; 328/150, 151, 115; 324/103 P

[56] References Cited

U.S. PATENT DOCUMENTS

| | | |
|---|---|---|
| 2,943,193 | 6/1960 | Webb . |
| 3,324,401 | 6/1967 | Heslop et al. . |
| 3,524,075 | 8/1970 | Matthews et al. ................. 307/351 |
| 3,714,593 | 1/1973 | Kime et al. . |
| 4,031,479 | 6/1977 | Thomas, Jr. et al. . |
| 4,038,568 | 7/1977 | May et al. . |
| 4,073,009 | 2/1978 | Andow et al. . |
| 4,090,145 | 5/1978 | Webb . |
| 4,091,297 | 5/1978 | Stephens . |
| 4,223,180 | 9/1980 | Eckels ................................. 307/352 |

Primary Examiner—John Zazworsky
Attorney, Agent, or Firm—Eugene A. Parsons

[57] ABSTRACT

A broadband peak detector comprising in combination a limiter coupled between an AC signal input means and a dual slope integrator, the integrator having a charging rate equal to twice its discharging rate. A comparator is coupled to the output of said integrator and has a threshold voltage set so that an output signal is produced when the integrator is discharged. The leading edge of said output signal triggers a monostable multivibrator to produce a pulse at quadrature which drives a sample and hold circuit to sample and hold the peak of the input signal.

10 Claims, 3 Drawing Figures

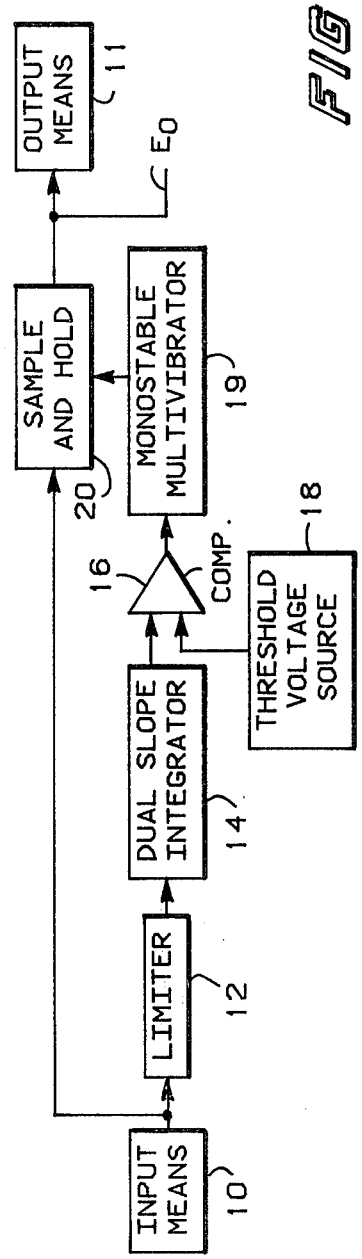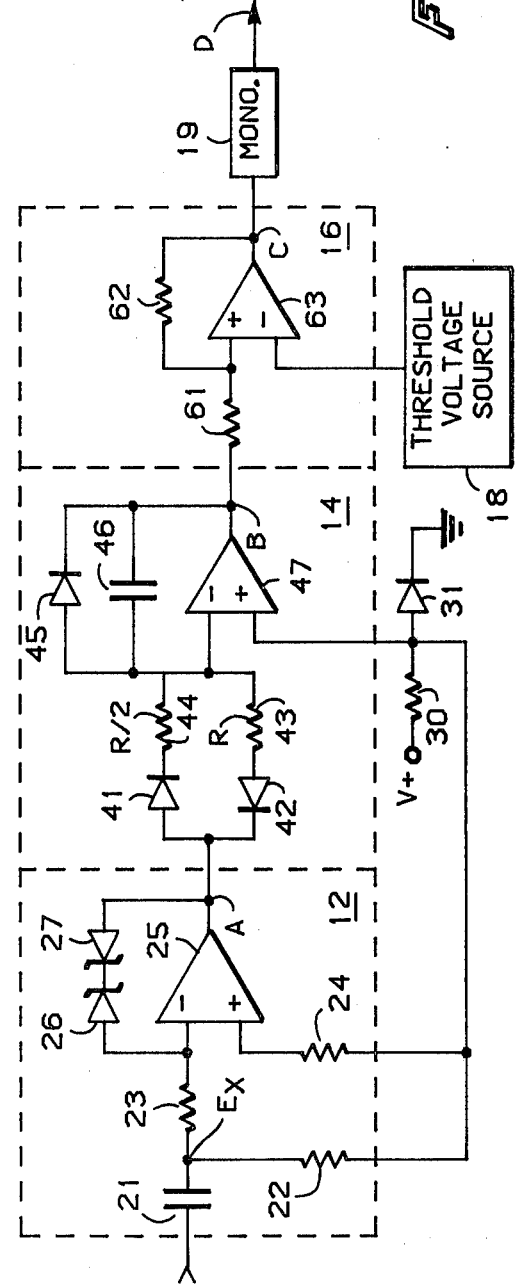

BROADBAND PEAK DETECTOR

FIELD OF THE INVENTION

The present invention relates to peak detectors and more particularly to broadband peak detectors.

Peak detectors have generally been used to sample modulated carriers. Using conventional approaches, wideband systems, such as the Doppler systems employed in radar applications, require detectors with short time constants to detect high frequencies and detectors with long time constants to detect low frequencies.

To avoid this problem, it is common to generate a quadrature or "Q" signal and to use the zero crossings of the quadrature waves as markers for sampling the in phase or "I" signal at peak levels. A sample and hold circuit can be used to maintain output at peak levels with low ripple. However, it is difficult and expensive to maintain the quadrature relationship between the I and Q signals.

SUMMARY OF THE INVENTION

Accordingly, it is an object of the present invention to provide a new and improved broadband peak detector.

It is a further object to provide a less complex broadband peak detector.

Yet another object is to provide a broadband peak detector having a wide dynamic range.

Still a further object is to provide a broadband peak detector which operates at low signal to noise ratios.

In order to attain the above mentioned and other objects and advantages, the present invention comprises a means for providing an input to a limiter which feeds a dual slope integrator having a discharging rate equal to twice its charging rate; a comparator having a threshold voltage such that said comparator provides an output signal when said integrator is discharged, said comparator being coupled to the output of said integrator and to the input of a means for generating a pulse responsive to said output signal, a sample and hold circuit responsive to said pulse, and a means for providing an output coupled to said sample and hold circuit.

Among the advantages of the present invention over the prior art are a decrease in complexity, a decrease in cost; and an increase in dynamic range.

BRIEF DESCRIPTION OF THE DRAWINGS

FIG. 1 is a block diagram of a broadband peak detector embodying the present invention;

FIG. 2 is a schematic diagram of a quadrature pulse generator embodying the present invention.

DESCRIPTION OF THE PREFERRED EMBODIMENT

Figure 3:
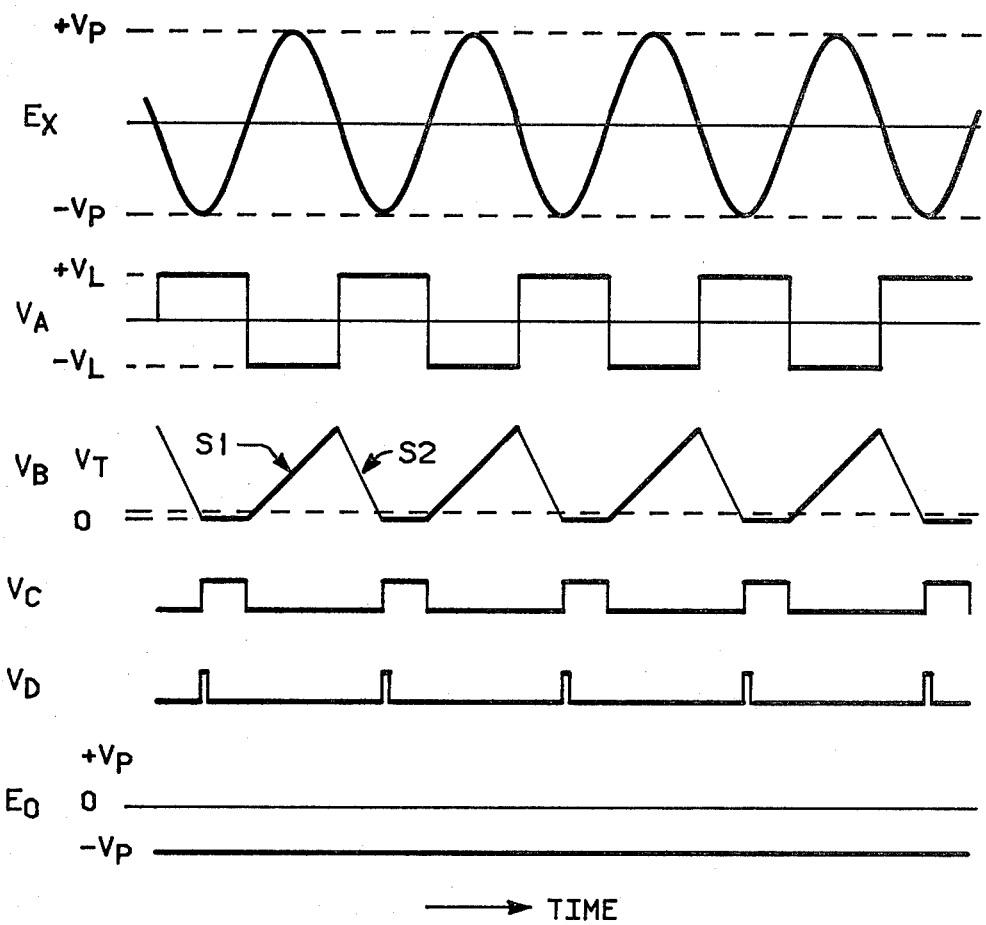
FIG. 3 is a set of representative waveforms present at various points within the embodiments shown in FIGS. 1 and 2.

In a preferred embodiment of the broadband peak detector as illustrated in FIG. 1, an input means 10, which can be any of a wide variety of apparatus for providing an input signal ranging from radar reception apparatus to input terminals, supplies a signal to a limiter 12 and to a sample and hold circuit 20. The signal as modified by limiter 12 is passed to a dual slope integrator 14 which provides a signal to a comparator 16. The threshold voltage for means of comparing signals 16 is set by a threshold voltage source 18. Output from comparator 16 is provided to a monostable multivibrator 19, although any pulse-generating device compatible with the rest of the system could be used, such as differentiating circuit having an appropriate time constant. The output of multivibrator 19 is supplied to sample and hold circuit 20 which feeds output means 11. One skilled in the art understands that other types of sampling circuits, such as integrate and hold circuits, may also be used. Output means 11 can be any of a variety of apparatus ranging from output terminals to display means or the like.

In a preferred embodiment of a quadrature pulse generator embodying the present invention as illustrated in FIG. 2, devices 12, 14 and 16 generally correspond to the limiter 12, integrator 14 and comparator 16 of FIG. 1, respectively. As can be seen in FIG. 2, a coupling capacitor 21 is connected to a first end of a resistor 22 and a first end of a resistor 23. A second end of resistor 23 is connected to the negative or inverting input of an operational amplifier 25 and also to the anode of a zener diode 26. The positive or non-inverting input of amplifier 25 is provided through a resistor 24. The output of amplifier 25 is passed to the anode of a zener diode 27, the cathode of which is connected to the cathode of zener diode 26. The output of amplifier 25 is also connected to the anode of a rectifier or diode 41 and the cathode of a rectifier or diode 42, which are part of integrator 14. A resistor 43 is connected between the anode of rectifier 42 and a junction formed by the anode of a rectifier 45, a first end of a capacitor 46 and the negative or inverting input of an operational amplifier 47. A resistor 44 is connected between the cathode of rectifier 41 and a junction formed by the anode of rectifier 45, the first end of capacitor 46 and the negative input of operational amplifier 47. The positive or non-inverting input of amplifier 47 connects with a second end of resistor 22, a second end of resistor 24, a first end of a resistor 30, and the anode of a rectifier 31. A second end of resistor 30 is connected to a source of positive potential V+ while the cathode of rectifier 31 is connected to ground.

The output of amplifier 47, a second end of capacitor 46, and the cathode of rectifier 45 all connect with a first end of a resistor 61, which is part of comparator 16. A second end of resistor 61 is connected to a first end of a resistor 62 and the positive input of a differential amplifier 63. The negative input of amplifier 63 is connected to threshold voltage source 18. As one skilled in the art understands, voltage source 18 may comprise a variable resistance or a fixed resistive network, connected to a source of potential.

The output of amplifier 63, and a second end of resistor 62 join to form an input to monostable multivibrator 19.

The present invention is useful for peak detection of a variety of waveforms, including square waves and Doppler sine waves. For example, after passing the RC coupler formed by resistor 22 and capacitor 21, a Doppler sine wave input supplied by input means 10 would be of the form labelled $E_X$, as shown in FIG. 3 at the point labelled $E_X$ in FIG. 2. In applications such as Doppler radar, where the amplitude of the signal can vary widely, it is useful to limit the signal for the purpose of generating a signal of fixed level regardless of amplitude. To accomplish this limitation, the signal, which has a negative peak of $-V_p$, as shown in FIG. 3, is passed through limiter 12, in which the positive input to amplifier 25 is fixed by a temperature compensation reference voltage, $V_r$, across diode 31. $V_r$ varies with temperature to compensate for the temperature sensitive voltage drop across integrator clamp diode 45, in a manner well-known to those skilled in the art. To simplify FIG. 3 and to clarify the description of my invention, $V_r$ and the forward drop across diode 45 are hereinafter assumed to be zero. This assumption reduces the DC offsets of waveforms at $E_x$ and A from $V_r$ to zero, as shown in FIG. 3. As understood by one skilled in the art, a limiter need not appear at this point if, for example, the input means comprises a means for reception of a radio frequency signal incorporating automatic gain control. The signal passes through resistor 23 to cause amplifier 25 to produce an output signal opposite in sign. The opposed zeners 26 and 27 have a common breakdown voltage and feed back or feed forward to maintain a voltage $V_A$ at the input of integrator 14 (labelled A in FIG. 2) between $+V_L$ and $-V_L$ so that the signal from amplifier 25 appears as shown in the portion of FIG. 3 labelled $V_A$. One skilled in the art understands that a limiter may not be required where signal amplitude is well defined.

In dual slope integrator 14, a negative signal from limiter 12 passes forward through rectifier 42 and resistor 43. The signal is integrated using capacitor 46 to turn on amplifier 47 (increasing the value of $V_B$) gradually while $V_A$ is clamped at $-V_L$. The positive input of amplifier 47 is fixed by its connection to the temperature compensation reference potential across rectifier 31. As stated earlier, this potential and the forward voltage drop across rectifier 45 are both assumed to be zero, for simplification. As $V_A$ rises above zero, current begins to flow through rectifier and capacitor 46 41. The value of resistor 44 is chosen to be one half that of resistor 43, so that the potential at B in FIG. 2 (depicted as $V_B$ in FIG. 3) falls twice as fast as it rose. In other words, slope $S_1$, and $S_2$, as shown in FIG. 3 are related by the equation $S_2 = -2S_1$. When the voltage drop across capacitor 46 falls to zero, diode 45 begins to conduct and the output at B becomes clamped at zero volts, independent of the simplifying assumption stated earlier. Therefore, the output signal of the integrator, depicted at $V_B$, reaches zero 90° delayed from the signal input at $E_x$. In this way a quadrature relationship is established. It will be understood by those skilled in the art that the same result will be obtained when a limiter is not used and the wave form at A is a sine wave, since for such a wave form, the integral for a negative half-cycle is twice the negative of the integral of the subsequent positive quarter-cycle.

Amplifier 63 produces a signal whenever the voltage applied across resistor 61 at its positive input equals the threshold voltage $V_T$ as set by voltage source 18 at the negative input of amplifier 63. As is shown in FIG. 3, $V_T$ is set to be approximately equal to zero so that amplifier 63 produces a signal only when $V_B$ is near zero. The resulting signal as it appears at point C in FIG. 2 is shown as $V_C$ in FIG. 3.

The leading edge of the output signal from comparator 16 is used to trigger monostable multivibrator 19 to produce a narrow pulse which appears at point D in FIG. 2 as shown at $V_D$ in FIG. 3. Resistors 61 and 62 provide a small amount of feedback which results in hysteresis for the switch point to reduce zero crossing chatter to avoid retriggering multivibrator 19. The pulse from multivibrator 19 is then used to drive an analog switch in sample and hold circuit 20. (See FIG. 1.)

The negative peak sampled and held by circuit 20 appears at $E_O$ in FIG. 1 and is illustrated at $E_O$ in FIG. 3. The value of the peak detected, indicated to be $-V_P$, is, of course, the value of the negative peak at input means 10. By switching the connections to the inputs of amplifier 25, positive peaks can be sampled.

While the present invention has been described in terms of a preferred embodiment, further modifications and improvements will occur to those skilled in the art. I desire it to be understood, therefore, that this invention is not limited to the particular form shown and I intend in the appended claims to cover all such equivalent variations which come within the scope of the invention as described.

What is claimed is:

1. An apparatus for generating a quadrature signal in response to an input signal comprising in combination: means for providing an input; a dual slope integrator having a discharging rate equal to twice its charging rate, said integrator having an input coupled to said means for providing an input and said integrator having an output; a reference source; a comparator having a threshold voltage set by said reference source such that said comparator provides an output signal when said integrator is discharged, said comparator having an input coupled to said output of said integrator, said comparator having an output; means for generating a pulse responsive to a leading edge of said output signal from said comparator; and means for providing an output coupled to said means for generating a pulse.

2. The apparatus recited in claim 1 wherein said integrator further comprises a limiter coupled to the input of the dual slope integrator.

3. The apparatus recited in claim 1 wherein said means for generating a pulse comprises a monostable multivibrator.

4. An apparatus for detecting peaks in a signal comprising in combination: means for providing an input; a dual slope integrator having a discharging rate equal to twice its charging rate, said integrator having an input coupled to said input means, said integrator having an output; a reference source; a comparator having a threshold voltage set by said reference source such that said comparator provides an output signal when said integrator is discharged, said comparator having an input coupled to said output of said integrator, said comparator having an output; means for generating a pulse responsive to a leading edge of said output signal from said comparator; a sampling circuit responsive to said means for generating a pulse, said sampling circuit having an input coupled to said means for providing an input; and means for providing an output coupled to said sampling circuit.

5. The apparatus recited in claim 4 wherein said integrator further comprises a limiter coupled to the input of the dual slope integrator.

6. The apparatus recited in claim 4 wherein said pulse generating means comprises a monostable multivibrator.

7. A radio frequency reception apparatus comprising in combination: means for reception of a radio frequency signal; means for putting said radio frequency signal into a condition suitable for detection, said means for putting having an input coupled to said means for reception; a dual slope integrator having a discharging rate equal to twice its charging rate, said integrator having an input coupled to said means for putting a radio frequency signal into a condition suitable for detection, said integrator having an output; a reference source; a comparator having a threshold voltage set by said reference source such that said comparator provides an output signal when said integrator is discharged, said comparator having an input coupled to said output of said integrator, said comparator having an output; means for generating a pulse responsive to a leading edge of said output signal from said comparator; a sampling circuit responsive to said means for generating a pulse, said sampling circuit having an input coupled to said means for reception of a radio frequency signal; and mens for utilizing output from said sampling circuit.

8. The apparatus recited in claim 7 wherein said means for putting comprises a limiter.

9. The apparatus recited in claim 7 wherein said pulse generating means comprises a monostable multivibrator.

10. A broadband peak detector having a quadrature generator comprising: a dual slope integrator having a discharging rate equal to twice its charging rate, said integrator having an output; a reference source; a means for comparing signals having a threshold voltage set by said voltage source such that said comparator provides an output signal when said integrator is discharged, said means for comparing having an input coupled to said output of said integrator, said means for comparing signals having an output; and means for generating a pulse responsive to a leading edge of said output signal from said means for comparing signals.

* * * * *